United States Patent
Lee

(10) Patent No.: US 9,900,008 B1
(45) Date of Patent: Feb. 20, 2018

(54) PRE-DRIVER AND REPLICA CIRCUIT AND DRIVER SYSTEM WITH THE SAME

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/594,852

(22) Filed: May 15, 2017

(51) Int. Cl.
    *H03K 19/003* (2006.01)
    *H03K 19/20* (2006.01)
    *H03K 19/0185* (2006.01)

(52) U.S. Cl.
    CPC ........... *H03K 19/00361* (2013.01); *H03K 19/018521* (2013.01); *H03K 19/20* (2013.01)

(58) Field of Classification Search
    None
    See application file for complete search history.

(56) References Cited

U.S. PATENT DOCUMENTS

| | | | | |
|---|---|---|---|---|
| 5,936,879 A | * | 8/1999 | Brouwer | G11C 11/22 365/104 |
| 6,310,505 B1 | * | 10/2001 | Ogawa | H03K 3/0315 327/276 |
| 2002/0021159 A1 | * | 2/2002 | Takahashi | H03K 5/133 327/283 |
| 2011/0084743 A1 | * | 4/2011 | Chen | H03K 3/0315 327/157 |

* cited by examiner

*Primary Examiner* — Jany Richardson
(74) *Attorney, Agent, or Firm* — McClure, Qualey & Rodack, LLP

(57) ABSTRACT

A pre-driver includes a first inverter, a second inverter, an amplifier, a first capacitor, and a second capacitor. The first inverter has an input terminal for receiving an input signal at an input node, and an output terminal coupled to an inner node. The second inverter has an input terminal coupled to the inner node, and an output terminal for outputting an output signal at an output node. The amplifier is configured to amplify the input signal by a gain factor so as to generate an amplified signal and an inverted amplified signal. The first capacitor has a first terminal coupled to the output node, and a second terminal for receiving the amplified signal. The second capacitor has a first terminal coupled to the inner node, and a second terminal for receiving the inverted amplified signal.

19 Claims, 12 Drawing Sheets

PRE-DRIVER AND REPLICA CIRCUIT AND DRIVER SYSTEM WITH THE SAME

BACKGROUND OF THE INVENTION

Field of the Invention

The disclosure generally relates to a pre-driver, and more specifically, to a pre-driver and a replica circuit using a negative capacitance mechanism for high-speed transmission and operation.

Description of the Related Art

For recent high-speed communication, jitter performance depends on short rising/falling time of clock signals. However, wiring and gate layout contributes a large parasitic capacitance, and it may increase the rising/falling time and limit the transmission speed of circuitry. Some prior documents use an inductor coupled in parallel with the parasitic capacitor, but these designs can only cover a narrow frequency range. Accordingly, there is a need to propose a novel solution for solving the problems of the prior art.

BRIEF SUMMARY OF THE INVENTION

In a preferred embodiment, the invention is directed to a pre-driver for driving an output driver, comprising: a first inverter, wherein the first inverter has an input terminal for receiving an input signal at an input node of the pre-driver, and an output terminal coupled to a first node; a second inverter, wherein the second inverter has an input terminal coupled to the first node, and an output terminal for outputting an output signal at an output node of the pre-driver according to the input signal for driving the output driver; an amplifier, amplifying the input signal by a gain factor so as to generate an amplified signal and an inverted amplified signal; a first capacitor, wherein the first capacitor has a first terminal coupled to the output node, and a second terminal for receiving the amplified signal; and a second capacitor, wherein the second capacitor has a first terminal coupled to the first node, and a second terminal for receiving the inverted amplified signal.

In some embodiments, a capacitance of the first capacitor is substantially equal to a total parasitic capacitance at the output node, and a capacitance of the second capacitor is substantially equal to a total parasitic capacitance at the first node.

In some embodiments, the gain factor is substantially equal to 2.

In some embodiments, the amplifier is supplied by a tunable supply voltage and a fixed supply voltage, and the gain factor is determined according to the tunable supply voltage.

In some embodiments, the amplifier comprises: a first N-type transistor, wherein the first N-type transistor has a control terminal coupled to an amplifier input node, a first terminal coupled to a ground voltage, and a second terminal coupled to a second node, and wherein the amplified input node is arranged for receiving the input signal; a first P-type transistor, wherein the first P-type transistor has a control terminal coupled to the second node, a first terminal coupled to the tunable supply voltage, and a second terminal coupled to the second node; a second P-type transistor, wherein the second P-type transistor has a control terminal coupled to the second node, a first terminal coupled to the tunable supply voltage, and a second terminal coupled to a first amplifier output node, and wherein the first amplifier output node is arranged for outputting the amplified signal; a third P-type transistor, wherein the third P-type transistor has a control terminal coupled to the amplifier input node, a first terminal coupled to the fixed supply voltage, and a second terminal coupled to a third node; a second N-type transistor, wherein the second N-type transistor has a control terminal coupled to the third node, a first terminal coupled to the ground voltage, and a second terminal coupled to the third node; and a third N-type transistor, wherein the third N-type transistor has a control terminal coupled to the third node, a first terminal coupled to the ground voltage, and a second terminal coupled to the first amplifier output node.

In some embodiments, the amplifier further comprises: a fourth N-type transistor, wherein the fourth N-type transistor has a control terminal coupled to the second node, a first terminal coupled to a second amplifier output node, and a second terminal coupled to the tunable supply voltage, and wherein the second amplifier output node is arranged for outputting the inverted amplified signal; a current sink, drawing a first current from the second amplifier output node to the ground voltage; a fourth P-type transistor, wherein the fourth P-type transistor has a control terminal coupled to the third node, a first terminal coupled to the second amplifier output node, and a second terminal coupled to the ground voltage; and a current source, supplying a second current from the fixed supply voltage to the second amplifier output node.

In a preferred embodiment, the invention is directed to a replica circuit for driving at least one output driver, comprising: a first inverter, wherein the first inverter has an input terminal for receiving an input signal at an input node of the replica circuit, and an output terminal coupled to a first node; a second inverter, wherein the second inverter has an input terminal coupled to the first node, and an output terminal for outputting an output signal at an output node of the replica circuit according to the input signal for driving the at least one output driver; an amplifier, amplifying the input signal by a gain factor so as generate an amplified signal and an inverted amplified signal; a first capacitor, wherein the first capacitor has a first terminal coupled to the output node, and a second terminal for receiving the amplified signal; a second capacitor, wherein the second capacitor has a first terminal coupled to the first node, and a second terminal for receiving the inverted amplified signal; a rising time comparator and counter (RTCC), comparing the output signal with the input signal, wherein the RTCC gradually increases a counter number if rising times of the output signal are not matched with rising times of the input signal; a digital-to-analog converter (DAC), converting the counter number into a reference voltage; and a regulator, supplying a tunable supply voltage to the amplifier according to the reference voltage, wherein the tunable supply voltage is substantially equal to the reference voltage.

In some embodiments, the RTCC stops increasing the counter number and then maintains the counter number at a constant value if the rising times of the output signal are matched with the rising times of the input signal.

In some embodiments, a capacitance of the first capacitor is substantially equal to a total parasitic capacitance at the output node, and a capacitance of the second capacitor is substantially equal to a total parasitic capacitance at the first node.

In some embodiments, the gain factor is substantially equal to 2.

In some embodiments, the amplifier is supplied by the tunable supply voltage and a fixed supply voltage, and the gain factor is determined according to the tunable supply voltage.

In some embodiments, the amplifier comprises: a first N-type transistor, wherein the first N-type transistor has a control terminal coupled to an amplifier input node, a first terminal coupled to a ground voltage, and a second terminal coupled to a second node, and wherein the amplified input node is arranged for receiving the input signal; a first P-type transistor, wherein the first P-type transistor has a control terminal coupled to the second node, a first terminal coupled to the tunable supply voltage, and a second terminal coupled to the second node; a second P-type transistor, wherein the second P-type transistor has a control terminal coupled to the second node, a first terminal coupled to the tunable supply voltage, and a second terminal coupled to a first amplifier output node, and wherein the first amplifier output node is arranged for outputting the amplified signal; a third P-type transistor, wherein the third P-type transistor has a control terminal coupled to the amplifier input node, a first terminal coupled to the fixed supply voltage, and a second terminal coupled to a third node; a second N-type transistor, wherein the second N-type transistor has a control terminal coupled to the third node, a first terminal coupled to the ground voltage, and a second terminal coupled to the third node; and a third N-type transistor, wherein the third N-type transistor has a control terminal coupled to the third node, a first terminal coupled to the ground voltage, and a second terminal coupled to the first amplifier output node.

In some embodiments, the amplifier further comprises: a fourth N-type transistor, wherein the fourth N-type transistor has a control terminal coupled to the second node, a first terminal coupled to a second amplifier output node, and a second terminal coupled to the tunable supply voltage, and wherein the second amplifier output node is arranged for outputting the inverted amplified signal; a current sink, drawing a first current from the second amplifier output node to the ground voltage; a fourth P-type transistor, wherein the fourth P-type transistor has a control terminal coupled to the third node, a first terminal coupled to the second amplifier output node, and a second terminal coupled to the ground voltage; and a current source, supplying a second current from the fixed supply voltage to the second amplifier output node.

In some embodiments, the RTCC comprises: a first edge detector, detecting the rising times of the input signal so as to generate a first detection signal; a second edge detector, detecting the rising times of the output signal so as to generate a second detection signal; a first NOR gate, wherein the first NOR gate has a first input terminal for receiving the first detection signal, a second input terminal coupled to a fourth node, and an output terminal coupled to a fifth node; a second NOR gate, wherein the second NOR gate has a first input terminal coupled to the fifth node, a second terminal for receiving the second detection signal, and an output terminal coupled to the fourth node, and wherein the fourth node is arranged for outputting a control clock; and a counter, generating the counter number according to the control clock, wherein the counter number comprises a plurality of bits, wherein every time the counter receives a pulse of the control clock, the counter increases the counter number by one.

In some embodiments, each of the first edge detector and the second edge detector comprises: an AND gate, wherein the AND gate has a first input terminal coupled to a sixth node, a second input terminal coupled to a seventh node, and an output terminal; a first resistor, wherein the first resistor has a first terminal coupled to the sixth node, and a second terminal coupled to the seventh node; and a third capacitor, wherein the third capacitor has a first terminal coupled to the seventh node, and a second terminal coupled to the ground voltage; wherein the sixth node is arranged for receiving the input signal or the output signal, and the output terminal of the AND gate is arranged for outputting the first detection signal or the second detection signal.

In some embodiments, the regulator comprises: a fifth P-type transistor, wherein the fifth P-type transistor has a control terminal coupled to an eighth node, a first terminal coupled to an independent supply voltage, and a second terminal coupled to the eighth node; a sixth P-type transistor, wherein the sixth P-type transistor has a control terminal coupled to the eighth node, a first terminal coupled to the independent supply voltage, and a second terminal coupled to a ninth node; a seventh P-type transistor, wherein the seventh P-type transistor has a control terminal coupled to the ninth node, a first terminal coupled to the independent supply voltage, and a second terminal coupled to a regulator output node, and wherein the regulator output node is arranged for outputting the tunable supply voltage; a fifth N-type transistor, wherein the fifth N-type transistor has a control terminal coupled to a tenth node, a first terminal coupled to an eleventh node, and a second terminal coupled to the eighth node; a sixth N-type transistor, wherein the sixth N-type transistor has a control terminal coupled to a regulator input node, a first terminal coupled to the eleventh node, and a second terminal coupled to the ninth node, and wherein the regulator input node is arranged for receiving the reference voltage; an independent current sink, drawing a third current from the eleventh node to the ground voltage; a second resistor, wherein the second resistor has a first terminal coupled to the regulator output node, and a second terminal coupled to the tenth node; and a third resistor, wherein the third resistor has a first terminal coupled to the tenth node, and a second terminal coupled to the ground voltage.

In a preferred embodiment, the invention is directed to a driver system, comprising: a plurality of pre-drivers; a plurality of output drivers, respectively coupled to the plurality of pre-drivers; and a replica circuit as claimed above, wherein the replica circuit supplies the tunable supply voltage to each of the plurality of pre-drivers.

In some embodiments, each of the plurality of pre-drivers is as claimed above.

In some embodiments, each of the plurality of pre-drivers receives a corresponding one of a plurality of input data signals, and the replica circuit receives a reference clock signal, wherein the frequency of the reference clock signal corresponds to the frequencies of the input data signals.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1A:
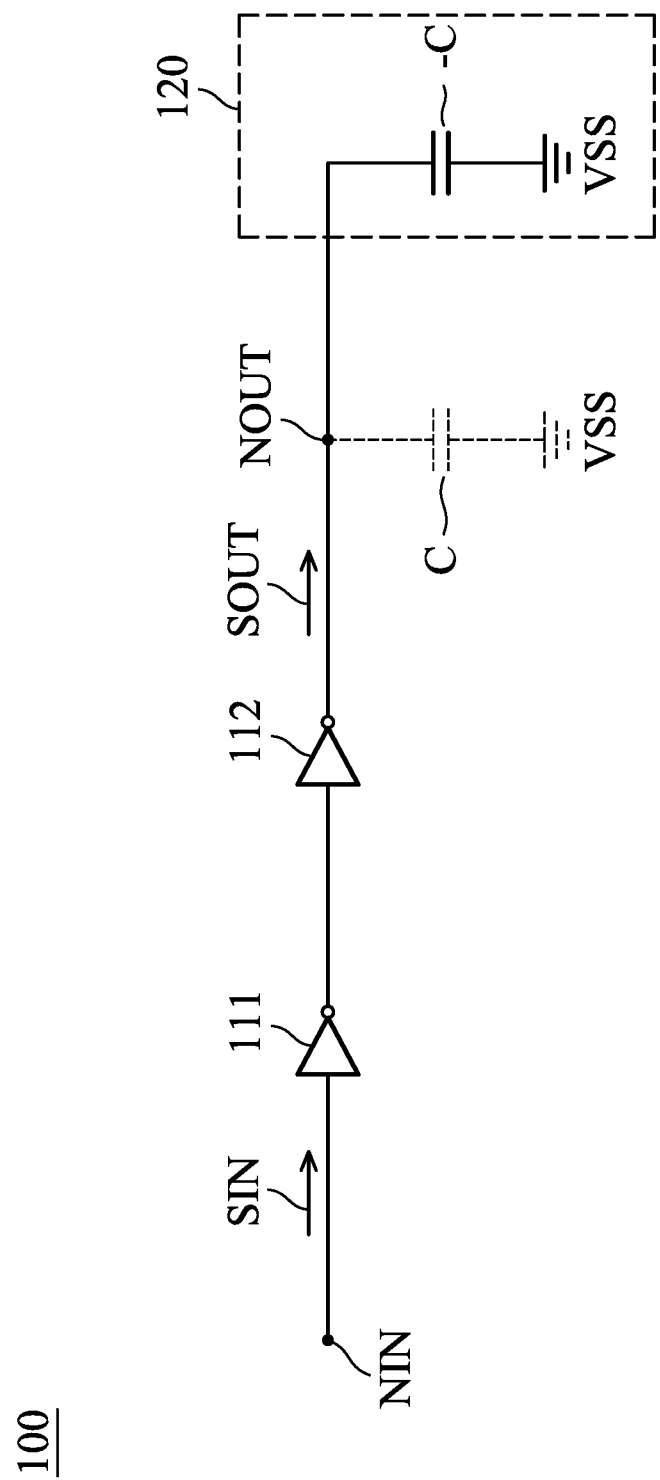
FIG. 1A is a diagram of a pre-driver according to an embodiment of the invention.

FIG. 1A is a diagram of a pre-driver 100 according to an embodiment of the invention. In the embodiment of FIG. 1A, the pre-driver 100 includes a first inverter 111 and a second inverter 112, which are coupled in series. The pre-driver 100 has an input node NIN for receiving an input signal SIN, and an output node NOUT for outputting an output signal SOUT according to the input signal SIN to drive a subsequent stage such as an output driver. By using the pre-driver 100, the output signal SOUT has a stronger capability for driving an output current. However, there is a parasitic capacitance at the output node NOUT, and it is modeled as a parasitic capacitor C coupled between the output node NOUT and a ground voltage VSS. The parasitic capacitor C may result from wiring and gate layout of the pre-driver 100. Unfortunately, the parasitic capacitor C increases rising/falling time of the output signal SOUT and reduces the transmission speed of the pre-driver 100. In order to solve the problem, the embodiment of FIG. 1 uses a negative capacitance mechanism 120 to compensate for the non-ideal parasitic capacitor C, and it is modeled as a negative capacitor −C coupled between the output node NOUT and the ground voltage VSS. With such a design, the transmission and operation speed of the pre-driver 100 is significantly improved because the parasitic capacitor C is cancelled by the parallel negative capacitor −C. Furthermore, the operation frequency range of the pre-driver 100 is not limited due to the negative capacitance mechanism 120.

Figure 1B:
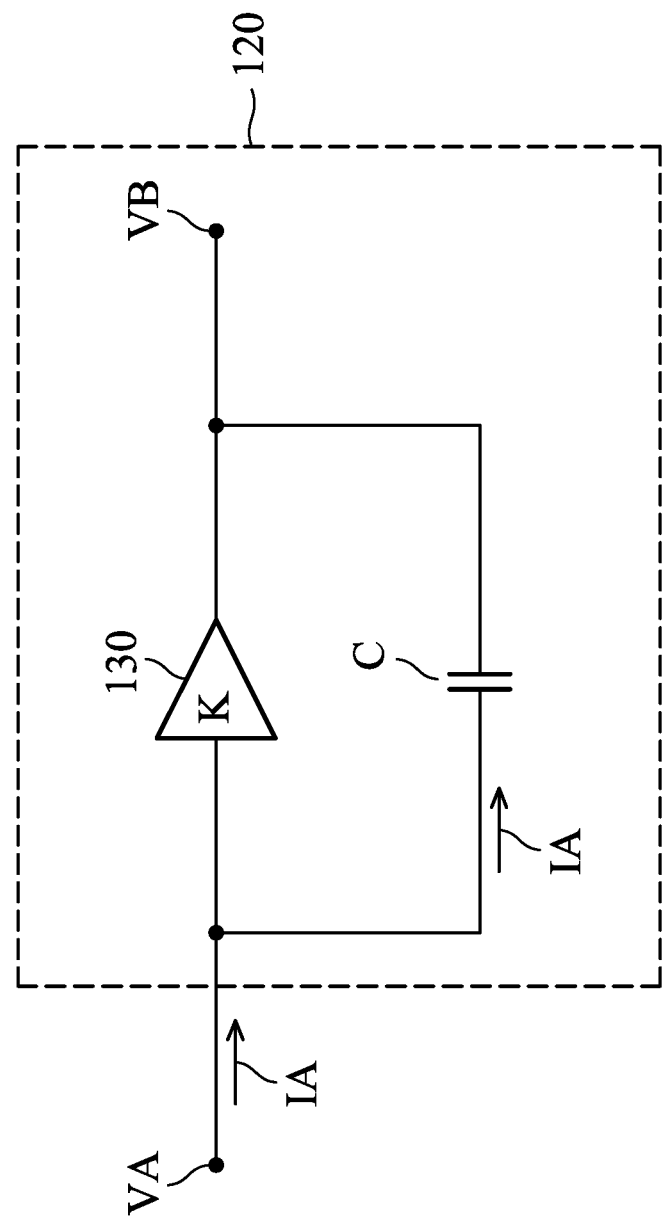
FIG. 1B is a diagram of a negative capacitance mechanism according to an embodiment of the invention.

FIG. 1B is a diagram of the negative capacitance mechanism 120 according to an embodiment of the invention. The embodiment of FIG. 1B describes a circuit solution to generate the negative capacitor −C. The negative capacitance mechanism 120 may be formed by a positive capacitor C and an amplifier 130. The amplifier 130 has a gain factor K, and it can amplify a first voltage VA by the gain factor K, so as to generate a second voltage VB. The positive capacitor C is coupled between the first voltage VA and the second voltage VB (i.e., between an input terminal and an output terminal of the amplifier 130). A current IA flows through the positive capacitor C. The effective impedance measured at the first voltage VA is calculated as the following equations (1) to (5).

$$IA = \frac{(VA - VB)}{\frac{1}{s \cdot C}} = (VA - VB) \cdot s \cdot C \quad (1)$$

$$VB = K \cdot VA \quad (2)$$

$$IA = (1 - K) \cdot VA \cdot s \cdot C \quad (3)$$

$$Z = \frac{VA}{IA} = \frac{1}{(1 - K) \cdot s \cdot C} \quad (4)$$

$$CE = (1 - K) \cdot C \quad (5)$$

where "VA" represents the voltage level of the first voltage VA, "VB" represents the voltage level of the second voltage VB, "C" represents the capacitance of the positive capacitor C, "K" represents the gain factor K of the amplifier 130, "s" represents the Laplace transform variable, "Z" represents the effective impedance measured at the first voltage VA, and "CE" represents the effective capacitance measured at the first voltage VA.

According to the equations (1) to (5), if the gain factor K is set to 2, the negative capacitor −C will be generated. The following embodiments will introduce the proposed design of the invention using the negative capacitance mechanism 120 to improve the transmission and operation speed of circuitry. It should be understood that these embodiments are merely exemplary, rather than restricted limitations of the invention.

Figure 2A:
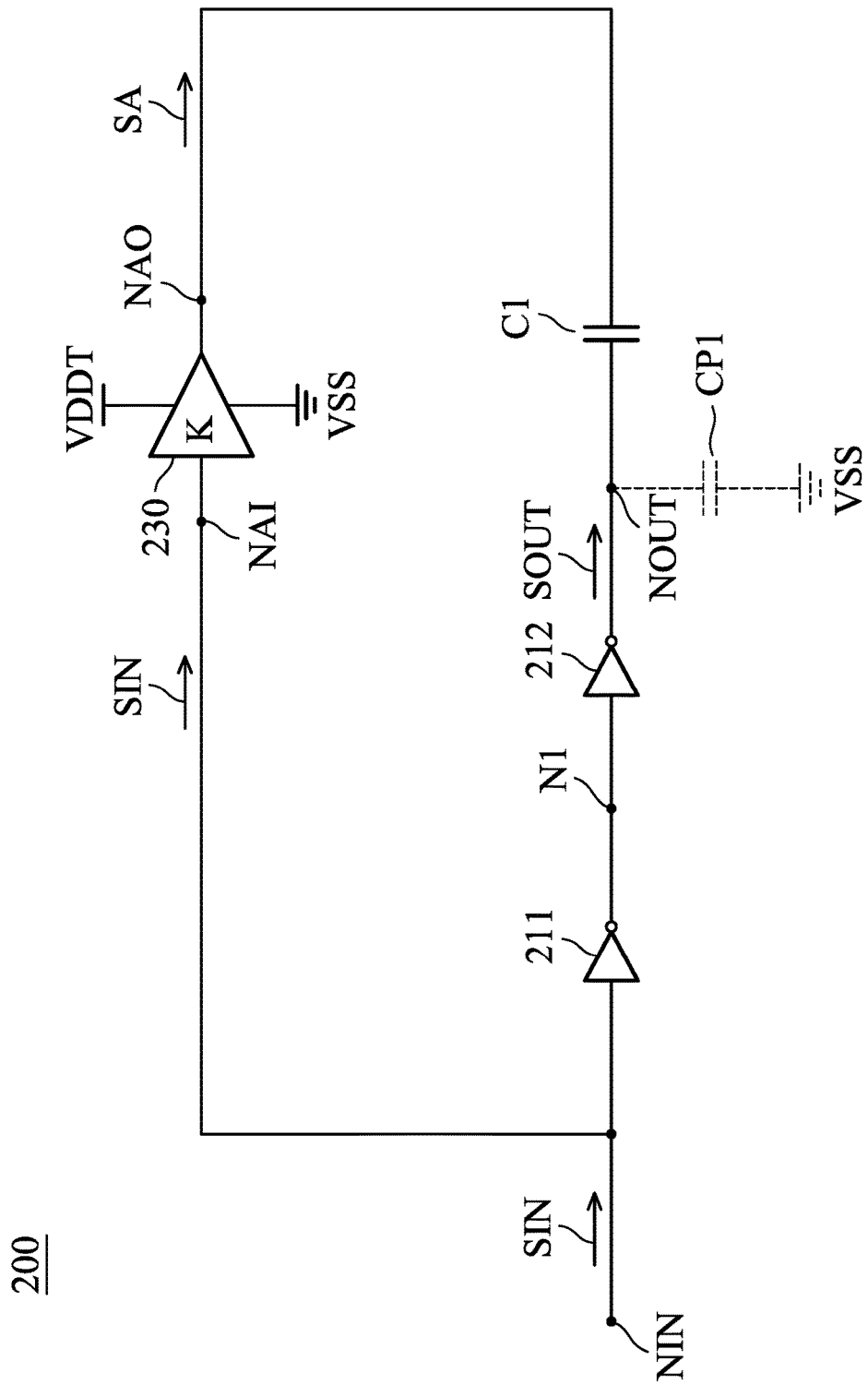
FIG. 2A is a diagram of a pre-driver according to an embodiment of the invention.

FIG. 2A is a diagram of a pre-driver 200 according to an embodiment of the invention. In the embodiment of FIG. 2A, the pre-driver 200 with an input node NIN and an output node NOUT includes a first inverter 211, a second inverter 212, an amplifier 230, and a first capacitor C1. The first inverter 211 has an input terminal for receiving an input signal SIN at the input node NIN, and an output terminal coupled to a first node N1. The second inverter 212 has an input terminal coupled to the first node N1, and an output terminal for outputting an output signal SOUT at an output node NOUT to drive a subsequent stage such as an output driver. The input signal SIN and the output signal SOUT may both be data or clock signals with different rising times. The amplifier 230 can amplify the input signal SIN by a gain factor K, so as to generate an amplified signal SA. The first capacitor C1 has a first terminal coupled to the output node NOUT, and a second terminal for receiving the amplified signal SA.

The total parasitic capacitance at the output node NOUT is modeled as a first parasitic capacitor CP1. For example, the capacitance of the first capacitor C1 may be substantially equal to the capacitance of the first parasitic capacitor CP1, and the gain factor K of the amplifier 230 may be substantially equal to 2, such that the first parasitic capacitor CP1 can be cancelled by the first capacitor C1 using the aforementioned negative capacitance mechanism. Accordingly, the transmission and operation speed of the pre-driver 200 can be improved. It should be noted that the invention is not limited to the above. In some embodiments, the amplifier 230 is supplied by a tunable supply voltage VDDT and a fixed supply voltage VDDF, and the gain factor K of the amplifier 230 is determined and adjusted according to the tunable supply voltage VDDT. That is, the aforementioned negative capacitance mechanism may be tunable for a variety of circuit applications, so as to meet different requirements.

Figure 2B:
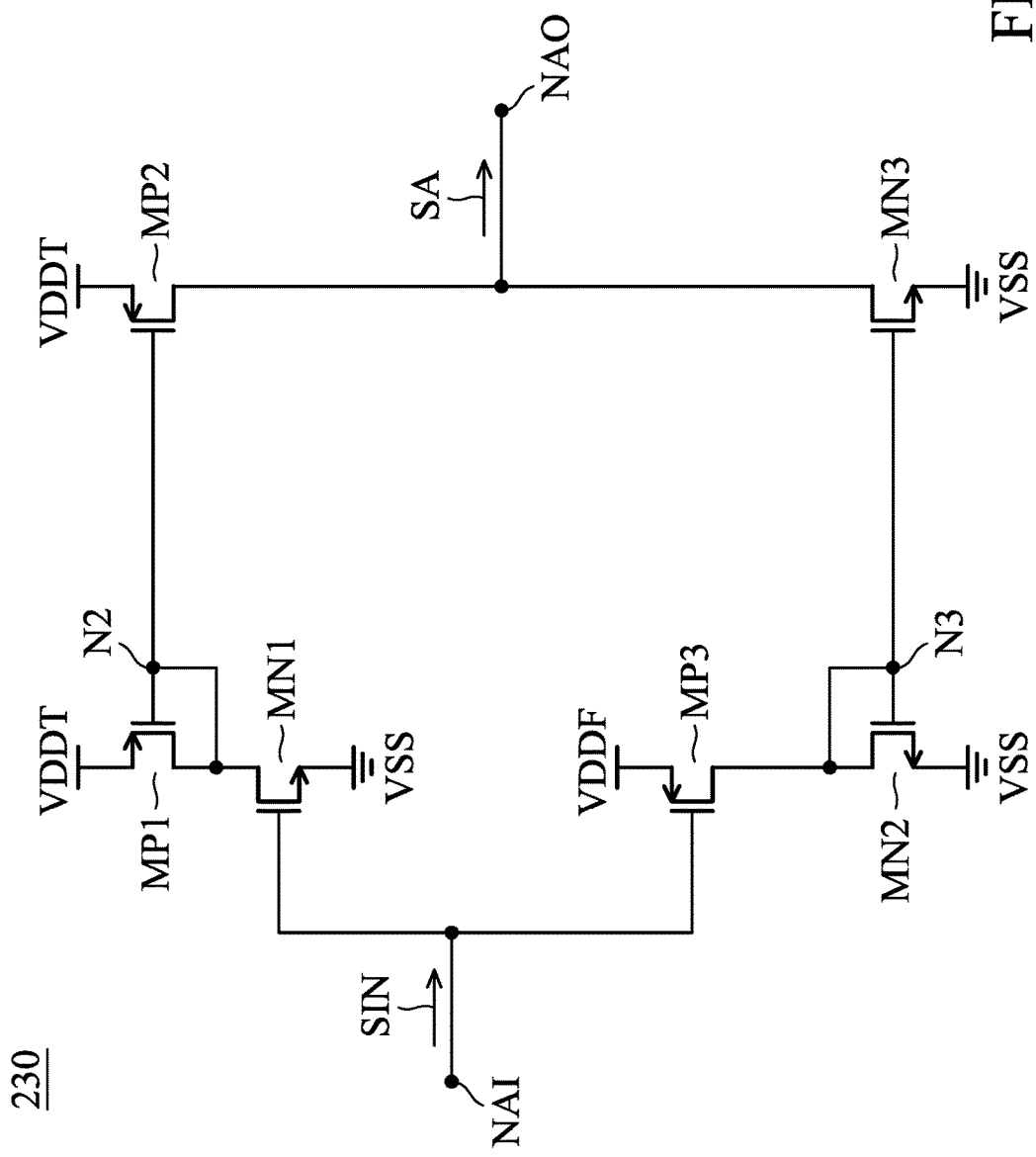
FIG. 2B is a diagram of an amplifier according to an embodiment of the invention.

FIG. 2B is a diagram of the amplifier 230 according to an embodiment of the invention. In the embodiment of FIG. 2B, the amplifier 230 includes a first P-type transistor MP1, a second P-type transistor MP2, a third P-type transistor MP3, a first N-type transistor MN1, a second N-type transistor MN2, and a third N-type transistor MN3. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The first N-type transistor MN1 has a control terminal coupled to an amplifier input node NAI, a first terminal coupled to the ground voltage VSS, and a second terminal coupled to a second node N2. The amplified input node NAI is arranged for receiving the input signal SIN. The first P-type transistor MP1 has a control terminal coupled to the second node N2, a first terminal coupled to the tunable supply voltage VDDT, and a second terminal coupled to the second node N2. The second P-type transistor MP2 has a control terminal coupled to the second node N2, a first terminal coupled to the tunable supply voltage VDDT, and a second terminal coupled to an amplifier output node NAO. The amplifier output node NAO is arranged for outputting the amplified signal SA. A first current mirror is formed by the first P-type transistor MP1 and the second P-type transistor MP2. The third P-type transistor MP3 has a control terminal coupled to the amplifier input node NAI, a first terminal coupled to the fixed supply voltage VDDF, and a second terminal coupled to a third node N3. The second N-type transistor MN2 has a control terminal coupled to the third node N3, a first terminal coupled to the ground voltage VSS, and a second terminal coupled to the third node N3. The third N-type transistor MN3 has a control terminal coupled to the third node N3, a first terminal coupled to the ground voltage VSS, and a second terminal coupled to the amplifier output node NAO. A second current mirror is formed by the second N-type transistor MN2 and the third N-type transistor MN3.

In the embodiment of FIG. 2B, the gain factor K of the amplifier 230 is calculated according to the ratio of the tunable supply voltage VDDT to the fixed supply voltage VDDF. For example, if the tunable supply voltage VDDT is equal to 2V and the fixed supply voltage VDDF is equal to 1V, the gain factor K of the amplifier 230 will be $$2\left(\frac{2\text{ V}}{1\text{ V}} = 2\right),$$

but it is not limited thereto. The gain factor K of the amplifier 230 may be easily adjusted by controlling the tunable supply voltage VDDT. In one embodiment, the fixed supply voltage VDDF may be the same as a high voltage level of the input signal SIN.

Figure 3A:
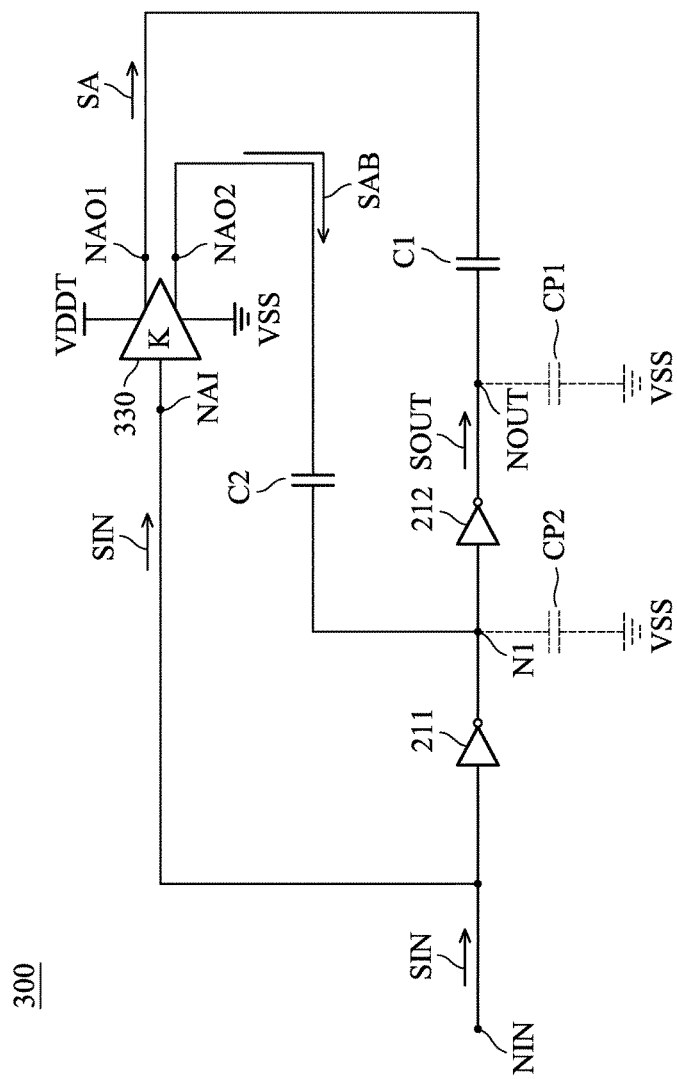
FIG. 3A is a diagram of a pre-driver according to an embodiment of the invention.

FIG. 3A is a diagram of a pre-driver 300 according to an embodiment of the invention. In the embodiment of FIG. 3A, the pre-driver 300 with an input node NIN and an output node NOUT includes a first inverter 211, a second inverter 212, an amplifier 330, a first capacitor C1, and a second capacitor C2. The first inverter 211 has an input terminal for receiving an input signal SIN at the input node NIN, and an output terminal coupled to a first node N1. The second inverter 212 has an input terminal coupled to the first node N1, and an output terminal for outputting an output signal SOUT at the output node NOUT according to the input signal SIN to drive a subsequent stage such as an output driver. The input signal SIN and the output signal SOUT may both be data or clock signals with different rising times. The amplifier 330 can amplify the input signal SIN by a gain factor K, so as to generate an amplified signal SA and an inverted amplified signal SAB. The inverted amplified signal SAB may have a complementary logic level to that of the amplified signal SA. The first capacitor C1 has a first terminal coupled to the output node NOUT, and a second terminal for receiving the amplified signal SA. The second capacitor C2 has a first terminal coupled to the first node N1, and a second terminal for receiving the inverted amplified signal SAB. The relationship between the above signals may be described by the following equations (6) and (7).

$$SA = K \cdot SIN \tag{6}$$

$$SAB = -K \cdot SIN \tag{7}$$

where "SA" represents the voltage level of the amplified signal SA, "SB" represents the voltage level of the inverted amplified signal SB, "SIN" represents the voltage level of the input signal SIN, and "K" represents the gain factor K of the amplifier 330. In one embodiment, the first inverter 211 and the second inverter 212 may be CMOS (Complementary Metal Oxide Semiconductor) inverters. In one embodiment, the size of the second inverter 212 (i.e., the aspect ratios (W/L) of the CMOS transistors of the second inverter 212) may be greater than the size of the first inverter 211 (i.e., the aspect ratios (W/L) of the CMOS transistors of the first inverter 211), such that the second inverter 212 has a stronger capability for driving currents than the first inverter 211 does.

The total parasitic capacitance at the output node NOUT is modeled as a first parasitic capacitor CP1. The total parasitic capacitance at the first node N1 is modeled as a second parasitic capacitor CP2. For example, the capacitance of the first capacitor C1 may be substantially equal to the capacitance of the first parasitic capacitor CP1, the capacitance of the second capacitor C2 may be substantially equal to the capacitance of the second parasitic capacitor CP2, and the gain factor K of the amplifier 330 may be substantially equal to 2, such that the first parasitic capacitor CP1 can be cancelled by the first capacitor C1, and the second parasitic capacitor CP2 can be cancelled by the second capacitor C2, using the aforementioned negative capacitance mechanism. Compared with the embodiment of FIG. 2A, the parasitic capacitance between the first inverter 211 and the second inverter 212 (i.e., the second parasitic capacitor CP2) is also considered and cancelled in the embodiment of FIG. 3A. Such a design can further increase the transmission and operation speed of the pre-driver 300. It should be noted that the invention is not limited to the above. In some embodiments, the amplifier 330 is supplied by a tunable supply voltage VDDT and a fixed supply voltage VDDF, and the gain factor K of the amplifier 330 is determined and adjusted according to the tunable supply voltage VDDT. That is, the aforementioned negative capacitance mechanism may be tunable for a variety of circuit applications, so as to meet different requirements.

Figure 3B:
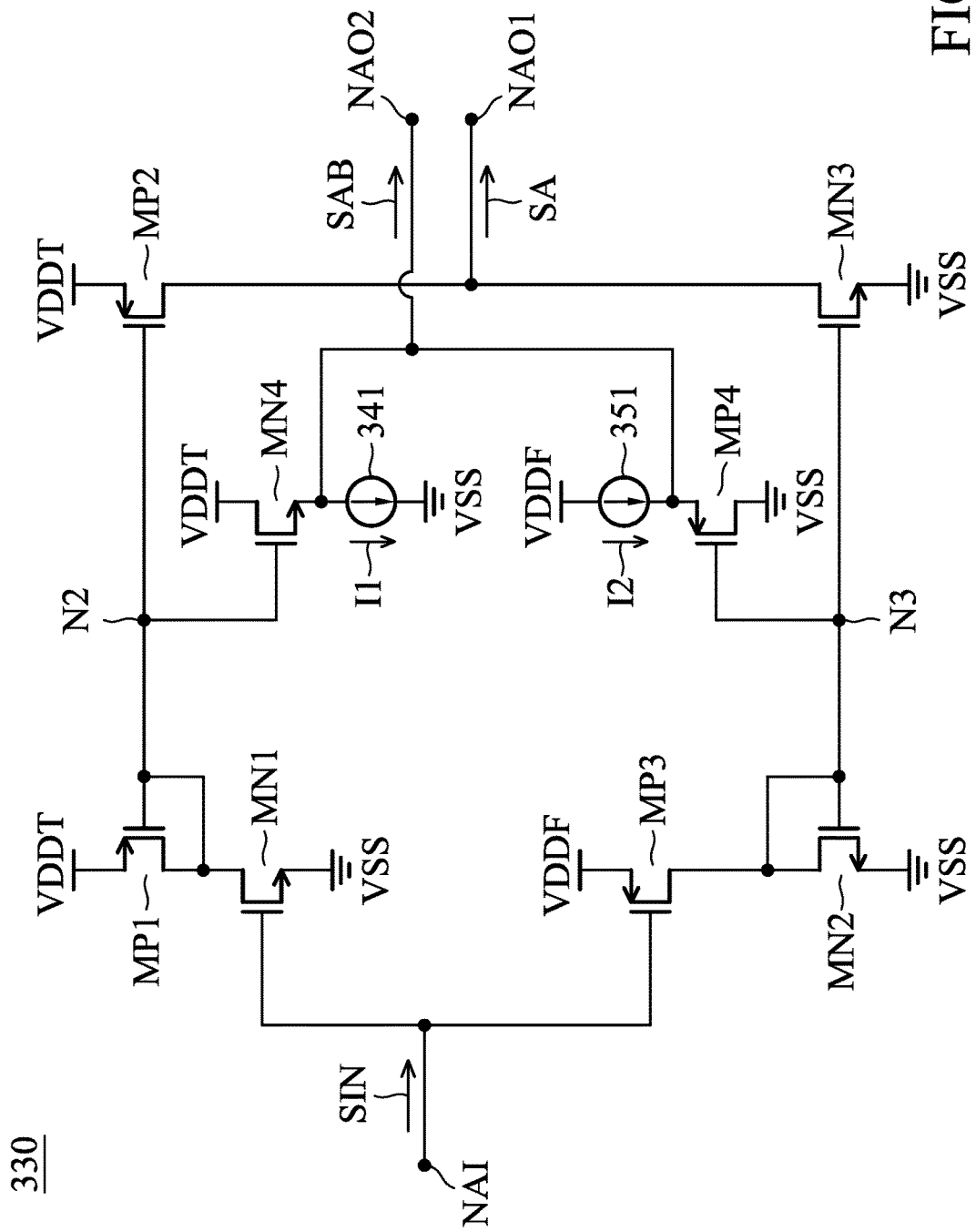
FIG. 3B is a diagram of an amplifier according to an embodiment of the invention.

FIG. 3B is a diagram of the amplifier 330 according to an embodiment of the invention. In the embodiment of FIG. 3B, the amplifier 330 includes a first P-type transistor MP1, a second P-type transistor MP2, a third P-type transistor MP3, a fourth P-type transistor MP4, a first N-type transistor MN1, a second N-type transistor MN2, a third N-type transistor MN3, a fourth N-type transistor MN4, a current sink 341, and a current source 351. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The first N-type transistor MN1 has a control terminal coupled to an amplifier input node NAI, a first terminal coupled to the ground voltage VSS, and a second terminal coupled to a second node N2. The amplified input node NAI is arranged for receiving the input signal SIN. The first P-type transistor MP1 has a control terminal coupled to the second node N2, a first terminal coupled to the tunable supply voltage VDDT, and a second terminal coupled to the second node N2. The second P-type transistor MP2 has a control terminal coupled to the second node N2, a first terminal coupled to the tunable supply voltage VDDT, and a second terminal coupled to a first amplifier output node NAO1. The first amplifier output node NAO1 is arranged for outputting the amplified signal SA. A first current mirror is formed by the first P-type transistor MP1 and the second P-type transistor MP2. The third P-type transistor MP3 has a control terminal coupled to the amplifier input node NAI, a first terminal coupled to the fixed supply voltage VDDF, and a second terminal coupled to a third node N3. The second N-type transistor MN2 has a control terminal coupled to the third node N3, a first terminal coupled to the ground voltage VSS, and a second terminal coupled to the third node N3. The third N-type transistor MN3 has a control terminal coupled to the third node N3, a first terminal coupled to the ground voltage VSS, and a second terminal coupled to the first amplifier output node NAO1. A second current mirror is formed by the second N-type transistor MN2 and the third N-type transistor MN3. The fourth N-type transistor MN4 has a control terminal coupled to the second node N2, a first terminal coupled to a second amplifier output node NAO2, and a second terminal coupled to the tunable supply voltage VDDT. The second amplifier output node NAO2 is arranged for outputting the inverted amplified signal SAB. The current sink 341 draws a first current I1 from the second amplifier output node NAO2 to the ground voltage VSS. The fourth P-type transistor MP4 has a control terminal coupled to the third node N3, a first terminal coupled to the second amplifier output node NAO2, and a second terminal coupled to the ground voltage VSS. The current source 351 supplies a second current I2 from the fixed supply voltage VDDF to the second amplifier output node NAO2. In some embodiments, the second current I2 is substantially equal to the first current I1. In alternative embodiments, the second current I2 is different from the first current I1.

In the embodiment of FIG. 3B, the gain factor K of the amplifier 330 is calculated according to the ratio of the tunable supply voltage VDDT to the fixed supply voltage VDDF. For example, if the tunable supply voltage VDDT is equal to 2V and the fixed supply voltage VDDF is equal to 1V, the gain factor K of the amplifier 330 will be $$2\left(\frac{2\text{ V}}{1\text{ V}}=2\right),$$

but it is not limited thereto. The gain factor K of the amplifier 330 may be easily adjusted by controlling the tunable supply voltage VDDT. In one embodiment, the fixed supply voltage VDDF may be the same as a high voltage level of the input signal SIN.

Figure 4:
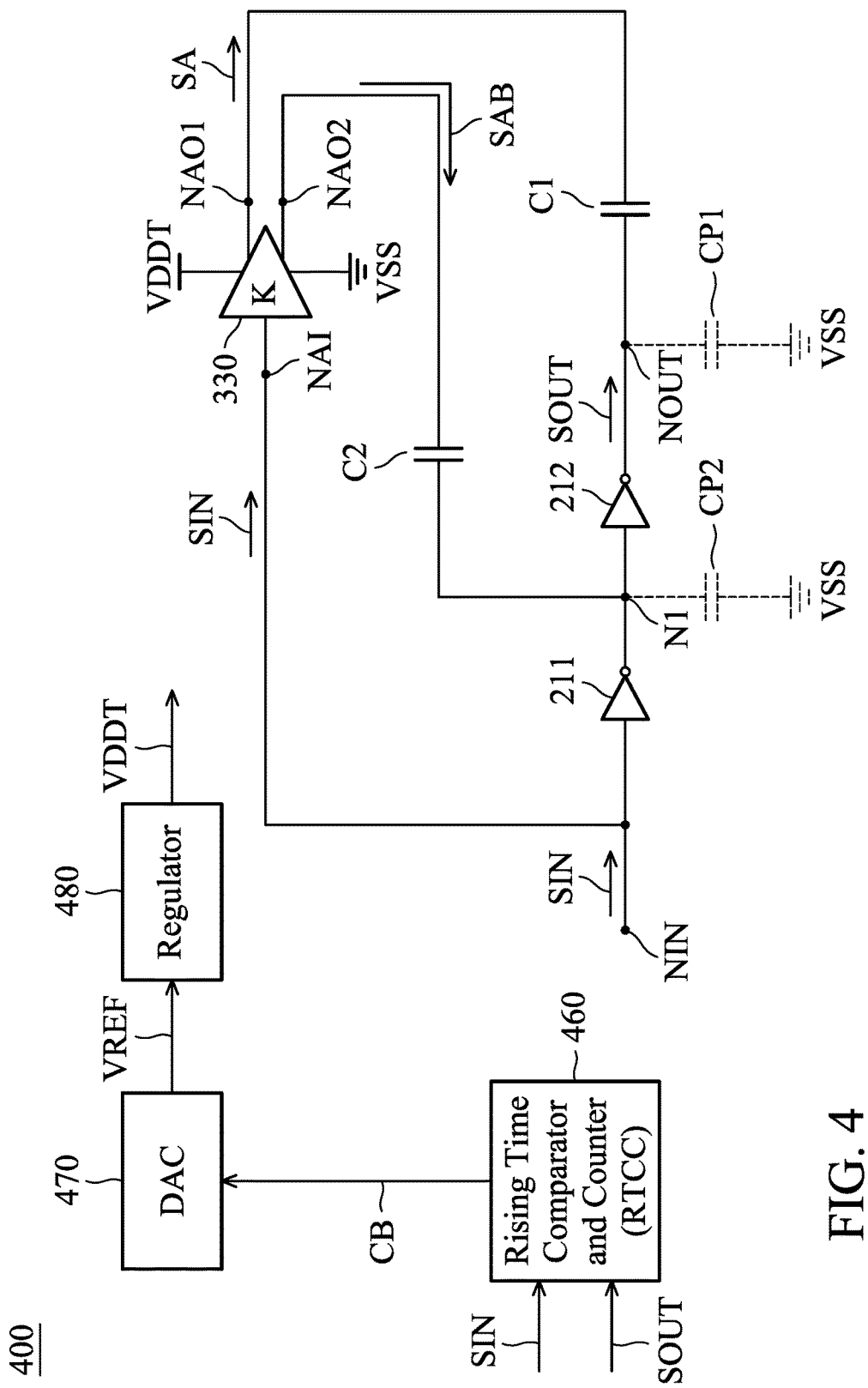
FIG. 4 is a diagram of a replica circuit according to an embodiment of the invention.

FIG. 4 is a diagram of a replica circuit 400 according to an embodiment of the invention. The replica circuit 400 may be used alone to drive a subsequent output driver, or used with a plurality of pre-drivers to drive multiple subsequent output drivers in a driver system described later. In the embodiment of FIG. 4, the pre-driver 400 with an input node NIN and an output node NOUT includes a first inverter 211, a second inverter 212, an amplifier 330, a first capacitor C1, a second capacitor C2, a rising time comparator and counter (RTCC) 460, a digital-to-analog converter (DAC) 470, and a regulator 480. The first inverter 211 has an input terminal for receiving an input signal SIN at the input node NIN, and an output terminal coupled to a first node N1. The second inverter 212 has an input terminal coupled to the first node N1, and an output terminal for outputting an output signal SOUT at the output node NOUT according to the input signal SIN to drive a subsequent stage such as an output driver. The input signal SIN and the output signal SOUT may both be data or clock signals with different rising times. The amplifier 330 can amplify the input signal SIN by a gain factor K, so as to generate an amplified signal SA and an inverted amplified signal SAB. The first capacitor C1 has a first terminal coupled to the output node NOUT, and a second terminal for receiving the amplified signal SA. The second capacitor C2 has a first terminal coupled to the first node N1, and a second terminal for receiving the inverted amplified signal SAB. The detailed settings and circuit structures of the amplifier 330, the first capacitor C1, and the second capacitor C2 have been described in the embodiments of FIG. 3A and FIG. 3B using the aforementioned negative capacitance mechanism. The amplifier 330 is supplied by a tunable supply voltage VDDT and a fixed supply voltage VDDF, and the gain factor K of the amplifier 330 is determined and adjusted according to the tunable supply voltage VDDT. In one embodiment, the first inverter 211 and the second inverter 212 may be CMOS (Complementary Metal Oxide Semiconductor) inverters. In one embodiment, the size of the second inverter 212 (i.e., the aspect ratios (W/L) of the CMOS transistors of the second inverter 212) may be greater than the size of the first inverter 211 (i.e., the aspect ratios (W/L) of the CMOS transistors of the first inverter 211), such that the second inverter 212 has a stronger capability for driving currents than the first inverter 211 does. Typical structures of the digital-to-analog converter (DAC) 470 are well known to those skilled in the art, and will not be described here.

In the replica circuit 400 of the embodiment of FIG. 4, the RTCC 460 compares the output signal SOUT with the input signal SIN, so as to optimize the tunable supply voltage VDDT and the gain factor K. Specifically, the RTCC 460 can gradually increase a counter number CB if the rising times of the output signal SOUT are not matched with the rising times of the input signal SIN. The DAC 470 can convert the counter number CB into a reference voltage VREF. The regulator 480 can supply the tunable supply voltage VDDT to the amplifier 330 according to the reference voltage VREF, and the tunable supply voltage VDDT may be substantially equal to the reference voltage VREF in on embodiment; the regulator 480 may supply the tunable supply voltage VDDT with driving capability to drive the amplifier 330. A calibration process for fine-tuning the tunable supply voltage VDDT and the gain factor K is performed by the RTCC 460, the DAC 470, and the regulator 480. Initially, the counter number CB may be set to a minimum value, and the RTCC 460 may start to continuously increase the counter number CB by comparing the output signal SOUT with the input signal SIN and finding that the output signal SOUT rises slower than the input signal SIN. Next, the RTCC 460 may stop increasing the counter number CB and then maintain the counter number CB at a constant value if the rising times of the output signal SOUT are matched with the rising times of the input signal SIN. The constant counter number CB means that the tunable supply voltage VDDT and the gain factor K have been fine-tuned, and the calibration process have been completed. In the embodiment, of FIG. 4, since the replica circuit 400 can automatically optimize the negative capacitance mechanism (i.e., fine-tune the capacitance of the negative capacitor), it can be applied to a variety of circuitry in which the capacitances of the first parasitic capacitor CP1 and the second parasitic capacitor CP2 are unknown, or in which the capacitances of the first capacitor C1 and the second capacitor C2 are set to any values. The proposed design can be easily used to improve the transmission and operation speed of any circuitry.

Figure 5:
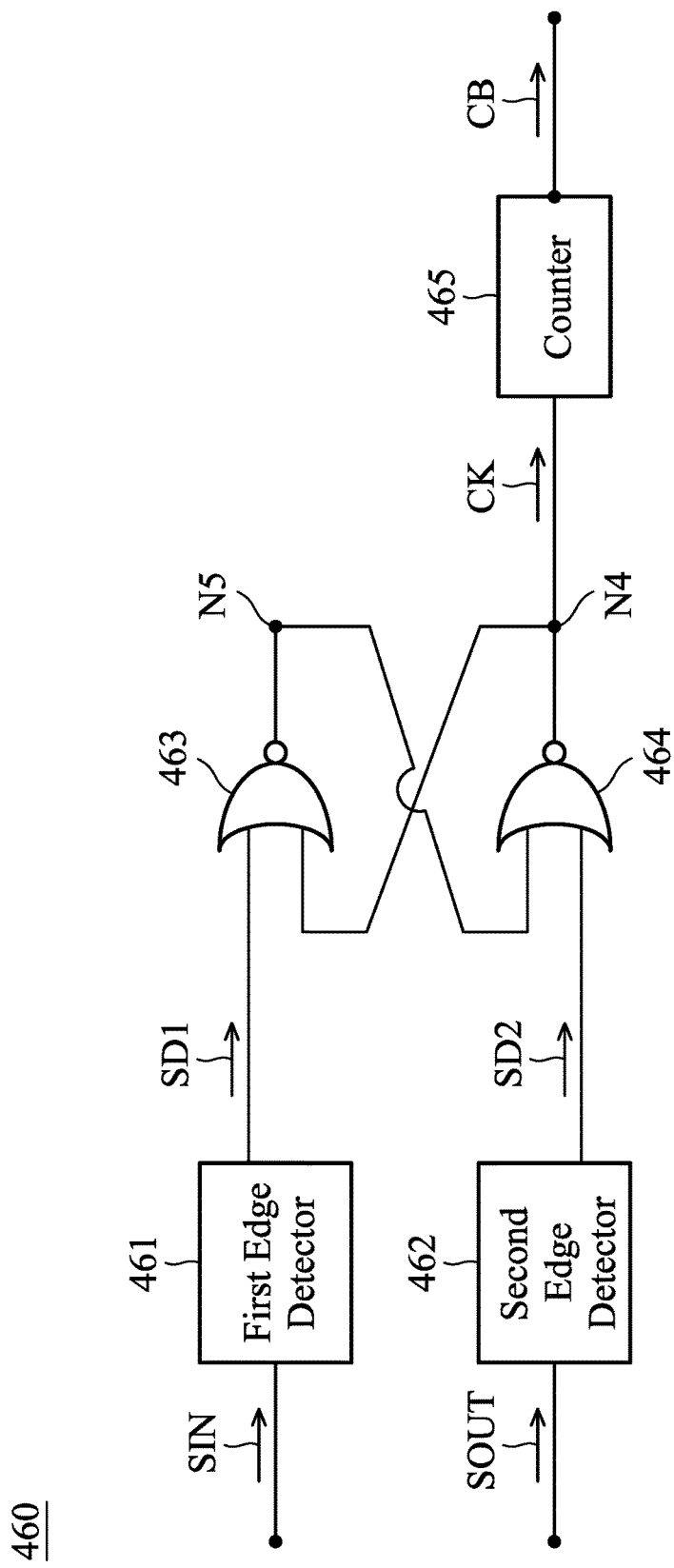
FIG. 5 is a diagram of a rising time comparator and counter according to an embodiment of the invention.

FIG. 5 is a diagram of the RTCC 460 according to an embodiment of the invention. In the embodiment of FIG. 5, the RTCC 460 includes a first edge detector 461, a second edge detector 462, a first NOR gate 463, a second NOR gate 464, and a counter 465. The first edge detector 461 detects the rising edges of the input signal SIN, so as to generate a first detection signal SD1. The first detection signal SD1 may include a plurality of pulses corresponding to the rising edges of the input signal SIN. The second edge detector 462 detects the rising edges of the output signal SOUT, so as to generate a second detection signal SD2. The second detection signal SD2 may include a plurality of pulses corresponding to the rising edges of the output signal SOUT. The first NOR gate 463 has a first input terminal for receiving the first detection signal SD1, a second input terminal coupled to a fourth node N4, and an output terminal coupled to a fifth node N5. The second NOR gate 464 has a first input terminal coupled to the fifth node N5, a second terminal for receiving the second detection signal SD2, and an output terminal coupled to the fourth node N4. A latch circuit is formed by the first NOR gate 463 and the second NOR gate 464. The fourth node N4 (i.e., the output terminal of the second NOR gate 464) is arranged for outputting a control clock CK. The counter 465 generates the counter number CB according to the control clock CK. For example, the counter number CB may include a plurality of bits, such as 3 bits, 4 bits, 5 bits, or more bits, and their combination represents a binary digital number. In some embodiments, every time the counter 465 receives a pulse (or a rising edge) of the control clock CK, the counter 465 can increase the counter number CB by one (e.g., from binary bits "001" to "010", or from binary bits "010" to "011", etc.). Typical structures of the counter 465 are well known to those skilled in the art, and will not be described here.

Figure 6:
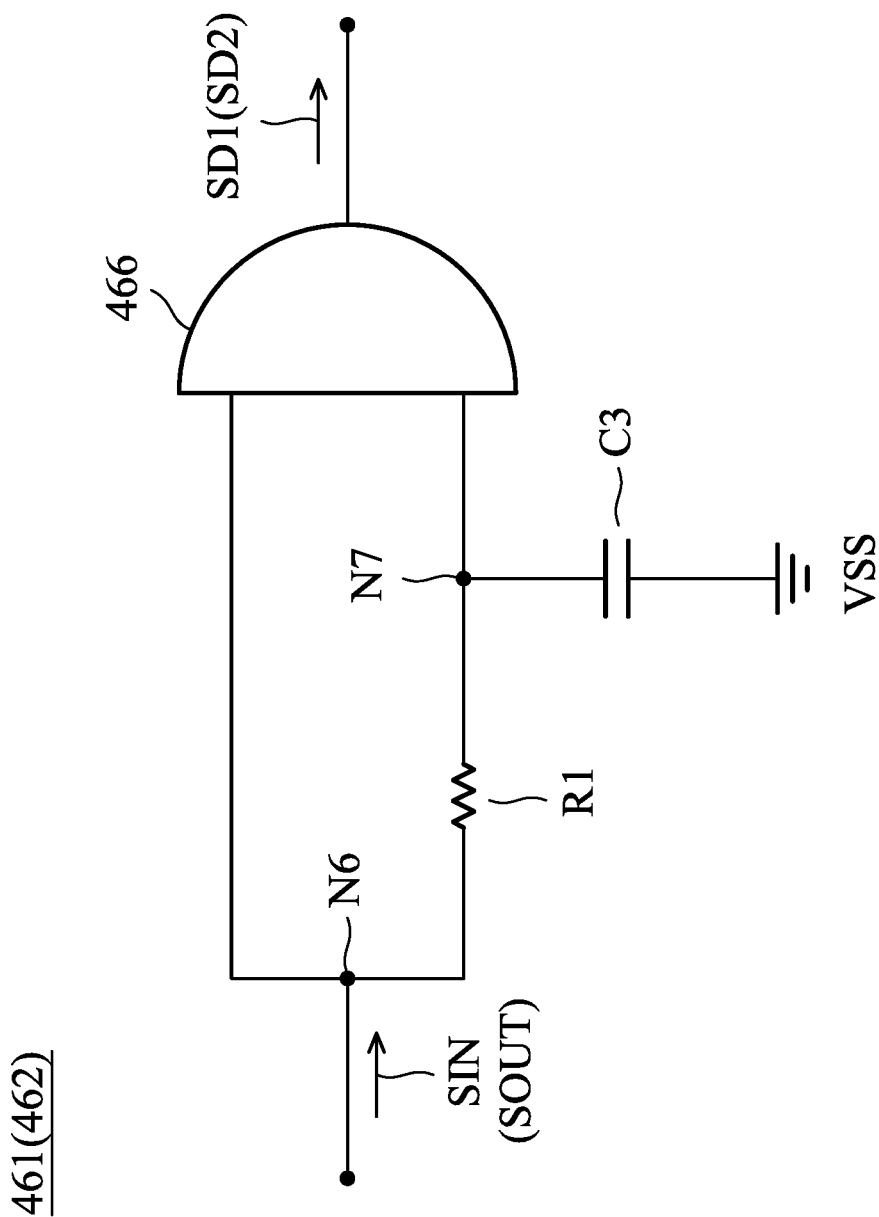
FIG. 6 is a diagram of an edge detector according to an embodiment of the invention.

FIG. 6 is a diagram of the first edge detector 461 or the second edge detector 462 according to an embodiment of the invention. In the embodiment of FIG. 6, each of the first edge detector 461 and the second edge detector 462 includes an AND gate 466, a first resistor R1, and a third capacitor C3. The AND gate 466 has a first input terminal coupled to a sixth node N6, a second input terminal coupled to a seventh node N7, and an output terminal. The first resistor R1 has a first terminal coupled to the sixth node N6, and a second terminal coupled to the seventh node N7. The third capacitor C3 has a first terminal coupled to the seventh node N7, and a second terminal coupled to the ground voltage VSS. The embodiment of FIG. 6 can describe the circuit structure of either the first edge detector 461 or the second edge detector 462. For the first edge detector 461, the sixth node N6 is arranged for receiving the input signal SIN, and the output terminal of the AND gate 466 is arranged for outputting the first detection signal SD1; alternatively, for the second edge detector 462, the sixth node N6 is arranged for receiving the output signal SOUT, and the output terminal of the AND gate 466 is arranged for outputting the second detection signal SD2.

Figure 7:
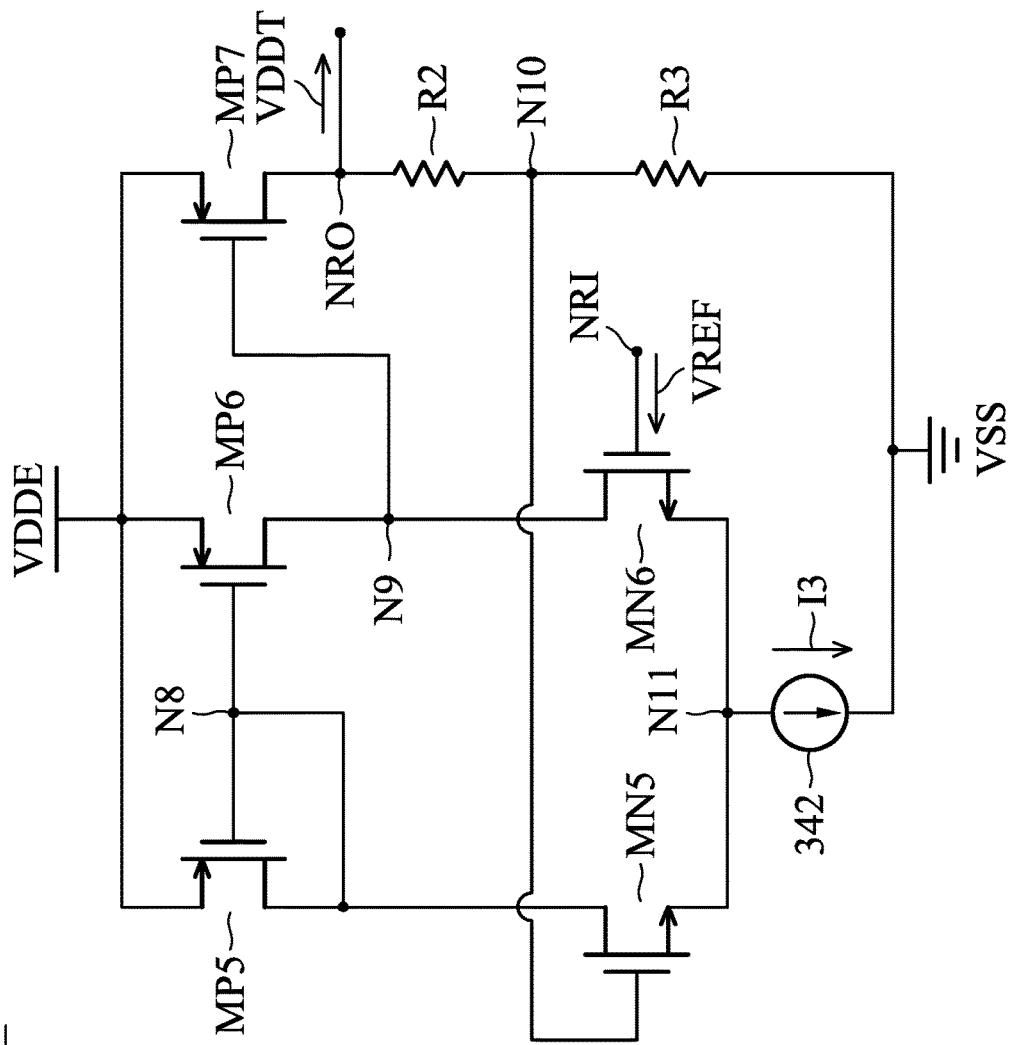
FIG. 7 is a diagram of a regulator according to an embodiment of the invention.

FIG. 7 is a diagram of the regulator 480 according to an embodiment of the invention. In the embodiment of FIG. 7, the regulator 480 includes a fifth P-type transistor MP5, a sixth P-type transistor MP6, a seventh P-type transistor MP7, a fifth N-type transistor MN5, a sixth N-type transistor MN6, a second resistor R2, a third resistor R3, and an independent current sink 342. For example, each P-type transistor may be a PMOS transistor (P-type Metal Oxide Semiconductor Field Effect Transistor), and each N-type transistor may be an NMOS transistor (N-type Metal Oxide Semiconductor Field Effect Transistor). The fifth P-type transistor MP5 has a control terminal coupled to an eighth node N8, a first terminal coupled to an independent supply voltage VDDE, and a second terminal coupled to the eighth node N8. The independent supply voltage VDDE may be any independent voltage source, such as a 2.5V DC (Direct Current) voltage source. The sixth P-type transistor MP6 has a control terminal coupled to the eighth node N8, a first terminal coupled to the independent supply voltage VDDE, and a second terminal coupled to a ninth node N9. The seventh P-type transistor MP7 has a control terminal coupled to the ninth node N9, a first terminal coupled to the independent supply voltage VDDE, and a second terminal coupled to a regulator output node NRO. The regulator output node NRO is arranged for outputting the tunable supply voltage VDDT. The fifth N-type transistor MN5 has a control terminal coupled to a tenth node N10, a first terminal coupled to an eleventh node N11, and a second terminal coupled to the eighth node N8. The sixth N-type transistor MN6 has a control terminal coupled to a regulator input node NRI, a first terminal coupled to the eleventh node N11, and a second terminal coupled to the ninth node N9. The regulator input node NRI is arranged for receiving the reference voltage VREF. The independent current sink 342 draws a third current I3 from the eleventh node N11 to the ground voltage VSS. The second resistor R2 has a first terminal coupled to the regulator output node NRO, and a second terminal coupled to the tenth node N10. The third resistor R3 has a first terminal coupled to the tenth node N10, and a second terminal coupled to the ground voltage VSS. The regulator 480 has a stronger capability for generating output currents at the regulator output node NRO, and thus it can use the tunable supply voltage VDDT (which may be substantially equal to the reference voltage VREF in one embodiment) to drive other devices.

Figure 8:
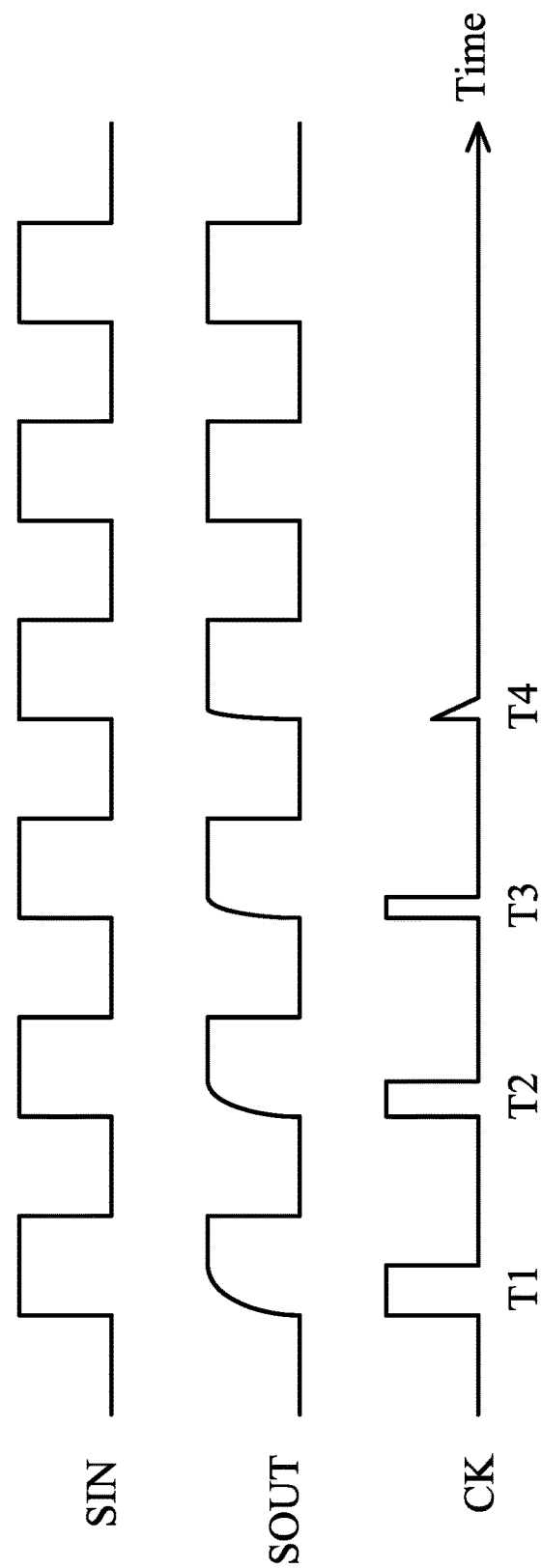
FIG. 8 is a diagram of signal waveforms of a replica circuit according to an embodiment of the invention.

FIG. 8 is a diagram of signal waveforms of the replica circuit 400 according to an embodiment of the invention.

The vertical axis represents the voltage level of each signal, and the horizontal axis represents time. Please refer to FIGS. 4 to 8 together. According to the simulation of FIG. 8, in the beginning (e.g., at the time points T1, T2, and T3), the rising times of the output signal SOUT are not matched with the rising times of the input signal SIN, and the control clock CK includes a plurality of pulses corresponding to the rising time mismatches between the output signal SOUT and the input signal SIN. The aforementioned rising time mismatches may result from RC delay due to the parasitic capacitance at the output node NOUT (i.e., the first parasitic capacitor CP1) and the parasitic capacitance at the first node N1 (i.e., the second parasitic capacitor CP2) which were not completely compensated. Next, the pulses of the control clock CK make the counter number CB of the RTCC 460 gradually increase, such that the tunable supply voltage VDDT becomes higher and the gain factor K of the amplifier 330 becomes larger. The negative capacitance mechanism relative to the replica circuit 400 is continuously enhanced during the calibration process (i.e., the negative capacitances increase to compensate the parasitic capacitances). Finally, (e.g., after the time point T4), the rising times of the output signal SOUT have been completely matched with the rising times of the input signal SIN, and therefore all of the pulses of the control clock CK vanish. That is, when the calibration process is completed, each of the tunable supply voltage VDDT and the gain factor K reaches a constant value, and the negative capacitance mechanism is optimized so as to cancel the whole non-ideal characteristics of the first parasitic capacitor CP1 and the second parasitic capacitor CP2. With the proposed design, the transmission and operation speed of the replica circuit 400 is automatically improved.

Figure 9:
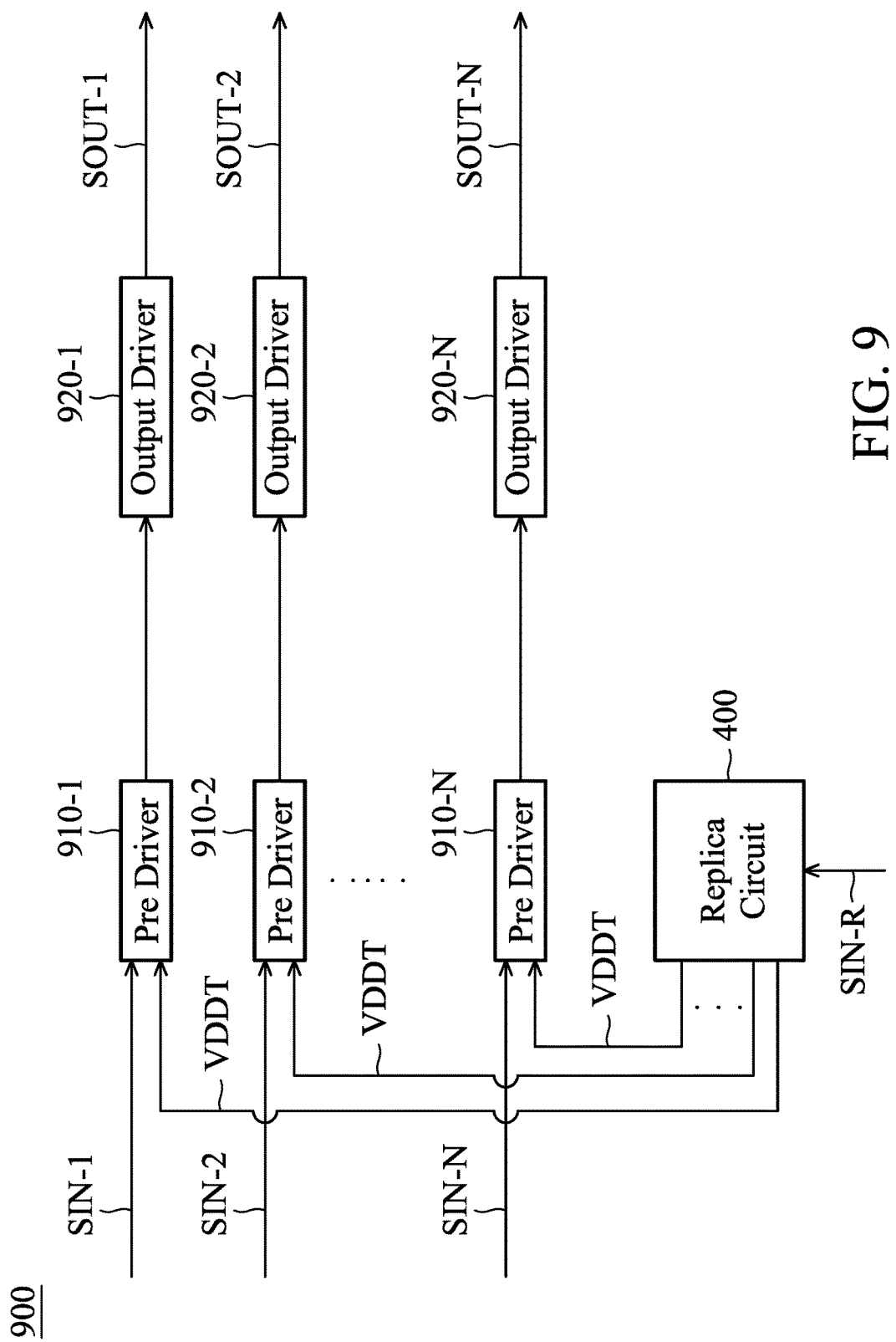
FIG. 9 is a diagram of a driver system according to an embodiment of the invention.

FIG. 9 is a diagram of a driver system 900 according to an embodiment of the invention. The driver system 900 includes a plurality of pre-drivers 910-1, 910-2, ..., and 910-N, a plurality of output drivers 920-1, 920-2, ..., and 920-N, and a replica circuit 400 (N is a positive integer greater than or equal to 1). The pre-drivers 910-1, 910-2, ..., and 910-N respectively receive a plurality of input signals SIN-1, SIN-2, ..., and SIN-N, which may be data signals. The output drivers 920-1, 920-2, ..., and 920-N are respectively coupled to the pre-drivers 910-1, 910-2, ..., and 910-N, and they are respectively driven by the pre-drivers 910-1, 910-2, ..., and 910-N. Each of the output drivers 920-1, 920-2, ..., and 920-N may be driven by one or more parallel signals from the corresponding one of the pre-drivers 910-1, 910-2, ..., and 910-N. The output drivers 920-1, 920-2, ..., and 920-N respectively generate a plurality of output signals SOUT-1, SOUT-2, ..., and SOUT-N, wherein each of the output signals SOUT-1, SOUT-2, ..., and SOUT-N may comprise one or more parallel signals (e.g. differential signal pairs). The replica circuit 400 receives a reference clock signal SIN-R and supplies a tunable supply voltage VDDT to each of the pre-drivers 910-1, 910-2, ..., and 910-N to compensate the parasitic capacitances at each of the pre-drivers 910-1, 910-2, ..., and 910-N. The reference clock signal SIN-R may have a frequency corresponding to the frequencies of the input signals SIN-1, SIN-2, ..., and SIN-N. The circuit structure of each of the pre-drivers 910-1, 910-2, ..., and 910-N may the same as that described in the embodiment of FIG. 2A or 3A. The circuit structure of the replica circuit 400 may the same as that described in the embodiment of FIG. 4. The driver system 900 may be applied to, for example, systems which include one or more output channels, such as High-Definition Multimedia Interface (HDMI), Display-Port, and DDR3 and DDR4 synchronous dynamic random-access memory (SDRAM); for example, HDMI comprises a red (R) channel, a green (G) channel, a blue (B) channel, and a clock (CK) channel, wherein each channel comprises a differential signal pair. Therefore, the transmission and operation speed of all the output channels with the proposed driver system can be significantly improved.

The invention provides a novel pre-driver, a novel replica circuit, and a driver system with the same. In conclusion, the proposed design has at least the following advantages over the prior art: (1) automatically compensating for non-ideal parasitic capacitance with a negative capacitance mechanism, (2) covering a wide frequency range, (3) providing a high transmission and operation speed of circuitry, and (4) being more insensitive to the variations of PVT (Process, Voltage, and Temperature) variations due to its self-calibration mechanism.

Note that the above voltages, currents, resistances, inductances, capacitances and other element parameters are not limitations of the invention. A designer can adjust these parameters according to different requirements. The pre-driver, the replica circuit, and the driver system of the invention are not limited to the configurations of FIGS. 1-9. The invention may merely include any one or more features of any one or more embodiments of FIGS. 1-9. In other words, not all of the features displayed in the figures should be implemented in the pre-driver, the replica circuit, and the driver system of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A pre-driver for driving an output driver, comprising:
a first inverter, wherein the first inverter has an input terminal for receiving an input signal at an input node of the pre-driver, and an output terminal coupled to a first node;
a second inverter, wherein the second inverter has an input terminal coupled to the first node, and an output terminal for outputting an output signal at an output node of the pre-driver according to the input signal for driving the output driver;
an amplifier, amplifying the input signal by a gain factor so as to generate an amplified signal and an inverted amplified signal;
a first capacitor, wherein the first capacitor has a first terminal coupled to the output node, and a second terminal for receiving the amplified signal; and
a second capacitor, wherein the second capacitor has a first terminal coupled to the first node, and a second terminal for receiving the inverted amplified signal.

2. The pre-driver as claimed in claim 1, wherein a capacitance of the first capacitor is substantially equal to a total parasitic capacitance at the output node, and a capacitance of the second capacitor is substantially equal to a total parasitic capacitance at the first node.

3. The pre-driver as claimed in claim 1, wherein the gain factor is substantially equal to 2.

4. The pre-driver as claimed in claim 1, wherein the amplifier is supplied by a tunable supply voltage and a fixed supply voltage, and the gain factor is determined according to the tunable supply voltage.

5. The pre-driver as claimed in claim 4, wherein the amplifier comprises:
   a first N-type transistor, wherein the first N-type transistor has a control terminal coupled to an amplifier input node, a first terminal coupled to a ground voltage, and a second terminal coupled to a second node, and wherein the amplified input node is arranged for receiving the input signal;
   a first P-type transistor, wherein the first P-type transistor has a control terminal coupled to the second node, a first terminal coupled to the tunable supply voltage, and a second terminal coupled to the second node;
   a second P-type transistor, wherein the second P-type transistor has a control terminal coupled to the second node, a first terminal coupled to the tunable supply voltage, and a second terminal coupled to a first amplifier output node, and wherein the first amplifier output node is arranged for outputting the amplified signal;
   a third P-type transistor, wherein the third P-type transistor has a control terminal coupled to the amplifier input node, a first terminal coupled to the fixed supply voltage, and a second terminal coupled to a third node;
   a second N-type transistor, wherein the second N-type transistor has a control terminal coupled to the third node, a first terminal coupled to the ground voltage, and a second terminal coupled to the third node; and
   a third N-type transistor, wherein the third N-type transistor has a control terminal coupled to the third node, a first terminal coupled to the ground voltage, and a second terminal coupled to the first amplifier output node.

6. The pre-driver as claimed in claim 5, wherein the amplifier further comprises:
   a fourth N-type transistor, wherein the fourth N-type transistor has a control terminal coupled to the second node, a first terminal coupled to a second amplifier output node, and a second terminal coupled to the tunable supply voltage, and wherein the second amplifier output node is arranged for outputting the inverted amplified signal;
   a current sink, drawing a first current from the second amplifier output node to the ground voltage;
   a fourth P-type transistor, wherein the fourth P-type transistor has a control terminal coupled to the third node, a first terminal coupled to the second amplifier output node, and a second terminal coupled to the ground voltage; and
   a current source, supplying a second current from the fixed supply voltage to the second amplifier output node.

7. A replica circuit for driving at least one output driver, comprising:
   a first inverter, wherein the first inverter has an input terminal for receiving an input signal at an input node of the replica circuit, and an output terminal coupled to a first node;
   a second inverter, wherein the second inverter has an input terminal coupled to the first node, and an output terminal for outputting an output signal at an output node of the replica circuit according to the input signal for driving the at least one output driver;
   an amplifier, amplifying the input signal by a gain factor so as generate an amplified signal and an inverted amplified signal;
   a first capacitor, wherein the first capacitor has a first terminal coupled to the output node, and a second terminal for receiving the amplified signal;
   a second capacitor, wherein the second capacitor has a first terminal coupled to the first node, and a second terminal for receiving the inverted amplified signal;
   a rising time comparator and counter (RTCC), comparing the output signal with the input signal, wherein the RTCC gradually increases a counter number if rising times of the output signal are not matched with rising times of the input signal;
   a digital-to-analog converter (DAC), converting the counter number into a reference voltage; and
   a regulator, supplying a tunable supply voltage to the amplifier according to the reference voltage, wherein the tunable supply voltage is substantially equal to the reference voltage.

8. The replica circuit as claimed in claim 7, wherein the RTCC stops increasing the counter number and then maintains the counter number at a constant value if the rising times of the output signal are matched with the rising times of the input signal.

9. The replica circuit as claimed in claim 7, wherein a capacitance of the first capacitor is substantially equal to a total parasitic capacitance at the output node, and a capacitance of the second capacitor is substantially equal to a total parasitic capacitance at the first node.

10. The replica circuit as claimed in claim 7, wherein the gain factor is substantially equal to 2.

11. The replica circuit as claimed in claim 7, wherein the amplifier is supplied by the tunable supply voltage and a fixed supply voltage, and the gain factor is determined according to the tunable supply voltage.

12. The replica circuit as claimed in claim 11, wherein the amplifier comprises:
   a first N-type transistor, wherein the first N-type transistor has a control terminal coupled to an amplifier input node, a first terminal coupled to a ground voltage, and a second terminal coupled to a second node, and wherein the amplified input node is arranged for receiving the input signal;
   a first P-type transistor, wherein the first P-type transistor has a control terminal coupled to the second node, a first terminal coupled to the tunable supply voltage, and a second terminal coupled to the second node;
   a second P-type transistor, wherein the second P-type transistor has a control terminal coupled to the second node, a first terminal coupled to the tunable supply voltage, and a second terminal coupled to a first amplifier output node, and wherein the first amplifier output node is arranged for outputting the amplified signal;
   a third P-type transistor, wherein the third P-type transistor has a control terminal coupled to the amplifier input node, a first terminal coupled to the fixed supply voltage, and a second terminal coupled to a third node;
   a second N-type transistor, wherein the second N-type transistor has a control terminal coupled to the third node, a first terminal coupled to the ground voltage, and a second terminal coupled to the third node; and a third N-type transistor, wherein the third N-type transistor has a control terminal coupled to the third node, a first terminal coupled to the ground voltage, and a second terminal coupled to the first amplifier output node.

13. The replica circuit as claimed in claim 12, wherein the amplifier further comprises:
a fourth N-type transistor, wherein the fourth N-type transistor has a control terminal coupled to the second node, a first terminal coupled to a second amplifier output node, and a second terminal coupled to the tunable supply voltage, and wherein the second amplifier output node is arranged for outputting the inverted amplified signal;
a current sink, drawing a first current from the second amplifier output node to the ground voltage;
a fourth P-type transistor, wherein the fourth P-type transistor has a control terminal coupled to the third node, a first terminal coupled to the second amplifier output node, and a second terminal coupled to the ground voltage; and
a current source, supplying a second current from the fixed supply voltage to the second amplifier output node.

14. The replica circuit as claimed in claim 7, wherein the RTCC comprises:
a first edge detector, detecting the rising times of the input signal so as to generate a first detection signal;
a second edge detector, detecting the rising times of the output signal so as to generate a second detection signal;
a first NOR gate, wherein the first NOR gate has a first input terminal for receiving the first detection signal, a second input terminal coupled to a fourth node, and an output terminal coupled to a fifth node;
a second NOR gate, wherein the second NOR gate has a first input terminal coupled to the fifth node, a second terminal for receiving the second detection signal, and an output terminal coupled to the fourth node, and wherein the fourth node is arranged for outputting a control clock; and
a counter, generating the counter number according to the control clock, wherein the counter number comprises a plurality of bits,
wherein every time the counter receives a pulse of the control clock, the counter increases the counter number by one.

15. The replica circuit as claimed in claim 14, wherein each of the first edge detector and the second edge detector comprises:
an AND gate, wherein the AND gate has a first input terminal coupled to a sixth node, a second input terminal coupled to a seventh node, and an output terminal;
a first resistor, wherein the first resistor has a first terminal coupled to the sixth node, and a second terminal coupled to the seventh node; and a third capacitor, wherein the third capacitor has a first terminal coupled to the seventh node, and a second terminal coupled to the ground voltage;
wherein the sixth node is arranged for receiving the input signal or the output signal, and the output terminal of the AND gate is arranged for outputting the first detection signal or the second detection signal.

16. The replica circuit as claimed in claim 7, wherein the regulator comprises:
a fifth P-type transistor, wherein the fifth P-type transistor has a control terminal coupled to an eighth node, a first terminal coupled to an independent supply voltage, and a second terminal coupled to the eighth node;
a sixth P-type transistor, wherein the sixth P-type transistor has a control terminal coupled to the eighth node, a first terminal coupled to the independent supply voltage, and a second terminal coupled to a ninth node;
a seventh P-type transistor, wherein the seventh P-type transistor has a control terminal coupled to the ninth node, a first terminal coupled to the independent supply voltage, and a second terminal coupled to a regulator output node, and wherein the regulator output node is arranged for outputting the tunable supply voltage;
a fifth N-type transistor, wherein the fifth N-type transistor has a control terminal coupled to a tenth node, a first terminal coupled to an eleventh node, and a second terminal coupled to the eighth node;
a sixth N-type transistor, wherein the sixth N-type transistor has a control terminal coupled to a regulator input node, a first terminal coupled to the eleventh node, and a second terminal coupled to the ninth node, and wherein the regulator input node is arranged for receiving the reference voltage;
an independent current sink, drawing a third current from the eleventh node to the ground voltage;
a second resistor, wherein the second resistor has a first terminal coupled to the regulator output node, and a second terminal coupled to the tenth node; and
a third resistor, wherein the third resistor has a first terminal coupled to the tenth node, and a second terminal coupled to the ground voltage.

17. A driver system, comprising:
a plurality of pre-drivers;
a plurality of output drivers, respectively coupled to the plurality of pre-drivers; and
a replica circuit as claimed in claim 7, wherein the replica circuit supplies the tunable supply voltage to each of the plurality of pre-drivers.

18. The driver system as claimed in claim 17, wherein each of the plurality of pre-drivers is as claimed in claim 1.

19. The driver system as claimed in claim 17, wherein each of the plurality of pre-drivers receives a corresponding one of a plurality of input data signals, and the replica circuit receives a reference clock signal, wherein the frequency of the reference clock signal corresponds to the frequencies of the input data signals.

* * * * *